(12) United States Patent
Kanemoto et al.

(10) Patent No.: US 6,962,281 B2
(45) Date of Patent: Nov. 8, 2005

(54) BONDING APPARATUS AND BONDING METHOD HAVING PROCESS FOR JUDGING BONDING STATE

(75) Inventors: Mitsunori Kanemoto, Tokyo (JP); Hiromi Sueda, Tokyo (JP); Keiji Takamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/436,088

(22) Filed: May 13, 2003

(65) Prior Publication Data

US 2003/0218050 A1 Nov. 27, 2003

(30) Foreign Application Priority Data

May 22, 2002 (JP) .............................. 2002-148349
Mar. 13, 2003 (JP) .............................. 2003-068914

(51) Int. Cl.[7] .......................... B23K 1/06; B23K 5/20; B23K 37/00; B23K 31/12
(52) U.S. Cl. ...................... 228/1.1; 228/56.5; 228/104
(58) Field of Search ............................. 228/103, 104, 228/110.1, 8, 56.5, 1.1; 73/570, 579, 584, 73/588, 602, 649, 651, 655, 658, 862, DIG. 1, 73/DIG. 4; 356/27, 28, 614, 615, 623, 394

(56) References Cited

U.S. PATENT DOCUMENTS 4,641,527 A * 2/1987 Hiroi et al. .................... 73/582
4,854,494 A * 8/1989 von Raben .................. 228/102
5,431,324 A * 7/1995 Kajiwara et al. ........... 228/102
6,181,431 B1 * 1/2001 Siu .............................. 356/502
6,233,045 B1 * 5/2001 Suni et al. .................. 356/28.5
6,279,810 B1 * 8/2001 Chan-Wong et al. ........ 228/1.1
6,490,047 B2 * 12/2002 Siu .............................. 356/502
6,543,668 B1 * 4/2003 Fujii et al. .................. 228/103
6,628,408 B1 * 9/2003 Franklin et al. ............ 356/623

FOREIGN PATENT DOCUMENTS

| JP | S63-191927 A | 8/1988 |
| JP | H07-335700 A | 12/1995 |
| JP | H09-148385 A | 6/1997 |
| JP | 10-326811 A | 12/1998 |

* cited by examiner

Primary Examiner—Colleen P. Cooke
(74) Attorney, Agent, or Firm—Sughrue Mion, PLLC

(57) ABSTRACT

In a bonding apparatus having an ultrasonic horn 3 coupled to an ultrasonic vibrator 5 and a bonding tool 4 coupled to the ultrasonic horn 3, and applying ultrasonic bonding to a work 11, by providing an ultrasonic detector 7 and an indicator 8 for displaying an output signal from the ultrasonic detector 7, there is obtained a bonding method that can easily make a good or bad judgment on the bonding state based on the output signal of the ultrasonic detector. With this arrangement, ultrasonic vibration of the bonding tool in the bonding apparatus using ultrasonic waves is constantly monitored, thereby reducing occurrence of bonding failure and making definite the time for replacing the bonding tool.

8 Claims, 10 Drawing Sheets

BONDING APPARATUS AND BONDING METHOD HAVING PROCESS FOR JUDGING BONDING STATE

BACKGROUND OF THE INVENTION

1. Field of the Invention

The present invention relates to a bonding apparatus and a bonding method having a process for judging whether a bonding state is good or bad, and in particular, relates to a bonding apparatus and a bonding method having a bonding state judging process, that performs, for example, wire bonding or die bonding to a semiconductor chip package etc. using ultrasonic vibration in fabrication of a semiconductor device.

2. Description of the Related Art

Conventionally, as a bonding method for a wire used in fabricating a semiconductor device, there have been known a nail head bonding type (thermal ultrasonic bonding type) using a gold wire, and a wedge bonding type using an aluminum wire.

The thermal ultrasonic bonding type using a gold wire that is strong against corrosion and excellent in expansibility has been frequently used for resin sealed semiconductor devices.

In a bonding apparatus of this type, a load to be applied to a semiconductor chip, a heating temperature, and the power and an applying time of ultrasonic waves to be used in combination with the heating can be set as parameters, and an ultrasonic oscillator in the bonding apparatus outputs the voltage corresponding to the set power for the set time to vibrate an ultrasonic horn.

As a result, a capillary attached to the tip of the ultrasonic horn is vibrated so that a gold wire is rubbed against an aluminum pad or inner lead of the semiconductor chip or the package so as to be bonded thereto.

However, even if the power and applying time of the ultrasonic waves are set, the degree of effectiveness of the ultrasonic waves changes depending on the condition such as the applied load, the mounting state of the capillary or the thermal expansion of the ultrasonic horn caused by the heating upon bonding, and thus does not precisely reflect the set values.

In view of this, various proposals have been presented to make it possible to monitor actual output voltage waveforms from a transducer upon bonding, thereby to monitor the bonding state.

FIG. 1 is a schematic diagram of a wire bonding apparatus disclosed in JP-A-H10-326811. An ultrasonic horn 23 is attached to a Z-movable mechanism 22 placed on an X-Y table 21, and a capillary 24 is retained at the tip of the ultrasonic horn 23. In the capillary 24, a gold wire (not shown) drawn out from a reel (not shown) is passed therethrough. To the other end of the ultrasonic horn 23 is coupled a transducer 25 that is connected to an ultrasonic oscillator 26, thereby to induce ultrasonic waves.

This vibration causes friction via the capillary 24 between the gold wire passing through the capillary 24 and a work 31, thereby realizing bonding therebetween. The foregoing operation is controlled by a bonder controller 29. Though not shown, there are further provided a torch for forming a ball at the tip of the gold wire and a clamper for retaining and tearing off the gold wire.

A voltage detector 27 is connected to output terminals of the transducer 25, and an arithmetic circuit 28 provided in the bonder controller 29 interprets a voltage waveform detected by the voltage detector 27. The arithmetic circuit 28 has a function of detecting a peak value P of the output voltage, a function of counting a voltage applying time T, a function of calculating the number n of waves equal to or greater than a transducer output voltage threshold value Vt set in the bonder controller 29, and a function of calculating the multiplication P·T·n as an ultrasonic effect index.

Herein, the voltage applying time T may be set as a time for which the voltage is, for example, 5% or greater than the expected maximum output voltage. This makes it possible to exclude a time period of extremely low output voltages so that the ultrasonic effect index well reflects an influence of the ultrasonic waves.

The value of the ultrasonic effect index P·T·n calculated by the arithmetic circuit 28 is displayed on a display unit 30 as a monitor via a display circuit provided in the bonder controller 29.

The first problem in the foregoing conventional bonding apparatus is that, although the output voltage of the transducer is detected by the voltage detector and the ultrasonic effect index is calculated by the arithmetic circuit based on the voltage waveform thereof and displayed on the display unit thereby to monitor the bonding state, a variation in mechanical vibration characteristic around the ultrasonic horn, i.e. deterioration of the capillary and so forth, can not be quantitatively seized from such an output voltage waveform.

The reason thereof is that inasmuch as the output waveform of the transducer is monitored, it is not possible to accurately seize a variation in mechanical vibration characteristic around the ultrasonic horn constituting the bonding apparatus.

The second problem is that, in the foregoing conventional bonding apparatus, although the output voltage of the transducer is detected by the voltage detector and the ultrasonic effect index is calculated by the arithmetic circuit based on the voltage waveform thereof and displayed on the display unit thereby to monitor the bonding state, since the output voltage of the transducer changes depending on a load applied to the work, the ultrasonic effect also changes when the applied load changes so that it is necessary to calculate again the reference ultrasonic effect index upon setting again the conditions of the wire bonding.

The reason thereof is that the ultrasonic effect index is the product P·T·n of the peak value P of the output voltage, the voltage applying time T and the number n of the specific waves, and does not rely on the applied load.

The third problem is that the time for replacing the capillary does not become definite.

The reason thereof is that when the calculation result of the ultrasonic effect falls outside the reference ultrasonic effect index, the bonding operation is stopped and only that defective chip is removed.

The fourth problem is that the ultrasonic effect index after the replacement of the capillary can not be calculated.

The reason thereof is that the ultrasonic effect index is calculated by the arithmetic circuit only upon actual bonding.

The fifth problem is that the ultrasonic effect index and a defective portion can not be seized.

The reason thereof is that the arithmetic circuit calculates the ultrasonic effect index and compares it only with the initial ultrasonic effect index.

The sixth problem is that it is necessary to calculate again the ultrasonic effect index upon changing the type of the works.

The reason thereof is that when changing the type of the works, it is necessary to calculate again the ultrasonic effect index upon initial bonding operation setting.

SUMMARY OF THE INVENTION

Therefore, it is an object of the present invention to provide an effective bonding apparatus that has solved the foregoing problems.

Another object of the present invention is to provide an effective bonding method that has solved the foregoing problems.

Specifically, an object of the present invention is to reduce a time for calculating the conventional ultrasonic effect index in an initial bonding position setting operation by prestoring all reference values of an ultrasonic detector in an arithmetic circuit using applying loads and ultrasonic powers as parameters.

Another object of the present invention is to improve the bonding quality by monitoring the joining states of all bonding points.

Another object of the present invention is to improve the productivity such that since the bonding states of all bonding points are monitored to manage such bonding states and defective portions, works defective in bonding can be removed using the results thereof in the processing after the bonding process to allow only non-defective semiconductor devices to be manufactured.

Another object of the present invention is to quantitatively seize the time for replacing a bonding tool, and more specifically, to quantitatively judge the time for replacing the bonding tool by monitoring a variation in output signal from an ultrasonic detector.

Another object of the present invention is to, for example, simplify screwing of a bonding tool by monitoring it using an ultrasonic detector upon bonding tool replacement, thereby to improve the maintainability.

Another object of the present invention is to enable setting of bonding conditions while confirming the bonding state, by monitoring it using an ultrasonic detector upon changing the type of works.

The foregoing objects can be accomplished by a bonding apparatus using ultrasonic waves that is characterized by having an ultrasonic detector.

The bonding apparatus may be provided with an indicator for displaying an output signal from such an ultrasonic detector.

Further, in the bonding apparatus having the ultrasonic detector or the bonding apparatus having the indicator for displaying the output signal from the ultrasonic detector, the foregoing objects can be accomplished by a bonding method that makes a good or bad judgment on the bonding state based on the output signal from the ultrasonic detector, or a bonding method that stores history of good or bad judgments on the bonding states.

More specifically, in the present invention, since vibration of ultrasonic waves from the tip of an ultrasonic horn is directly detected by the ultrasonic detector, the mechanical vibration characteristic of the ultrasonic horn is well reflected so that the state of the vibration of the ultrasonic horn, i.e. an actual influence of ultrasonic waves, is well reflected.

For example, when the work pressing state is bad so that the fixing state of the work itself is bad, when the vibration of the ultrasonic horn is slightly changed due to deterioration of the bonding tool, or when abnormality occurs with respect to components constituting the ultrasonic horn, i.e. when mechanically changed, it is difficult to accurately seize a variation in mechanical vibration characteristic of the bonding state according to the conventional method of simply calculating the ultrasonic effect index from the output voltage waveform of the ultrasonic vibrator. On the other hand, in the present invention, it becomes possible to detect a variation in mechanical vibration characteristic relative to a case of a normal operation.

Further, in the present invention, inasmuch as the mechanical vibration characteristic of the bonding state is judged by directly detecting the vibration from the bonding tool, it becomes possible to quantitatively seize a variation in mechanical vibration characteristic.

DESCRIPTION OF THE PREFERRED EMBODIMENT

Figure 1:
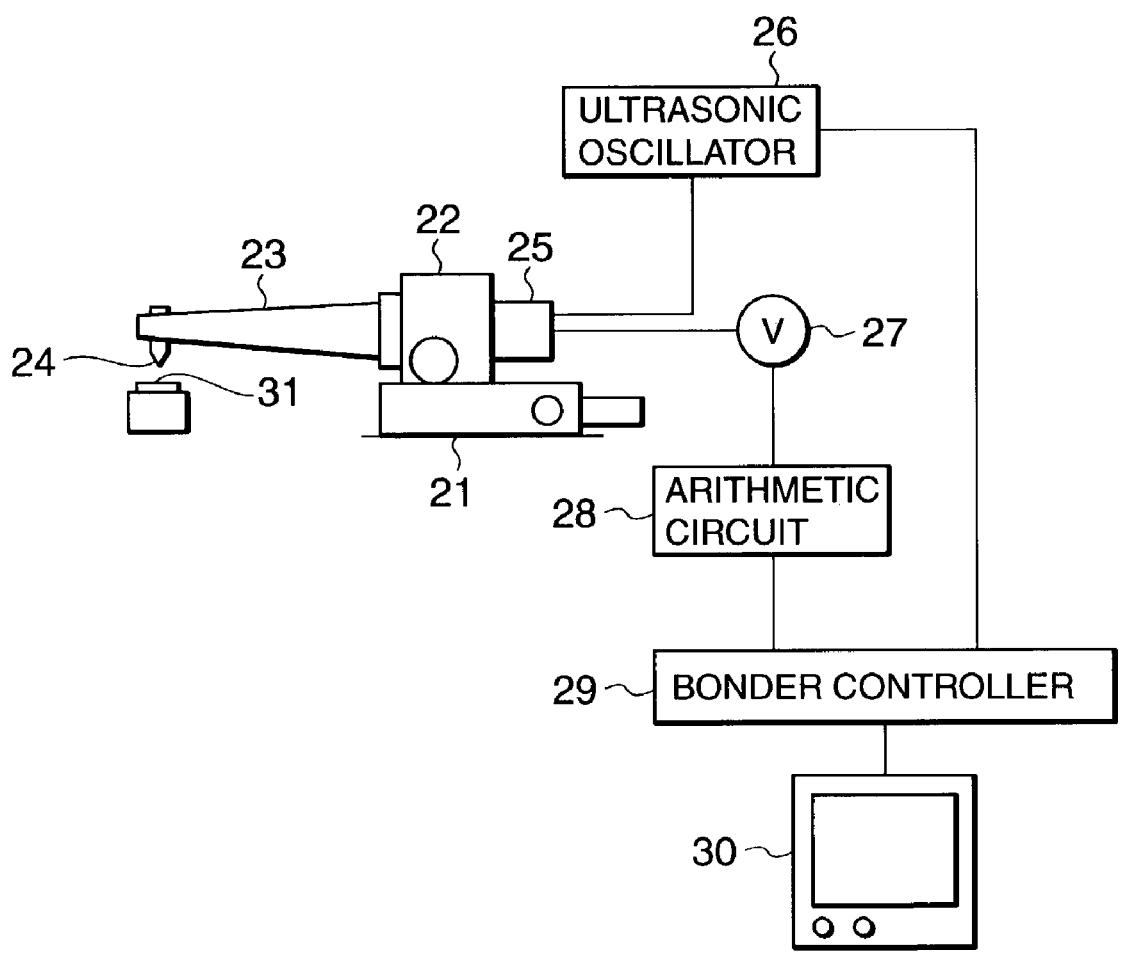
FIG. 1 is a schematic structural diagram showing a conventional ultrasonic bonding apparatus.
Figure 2:
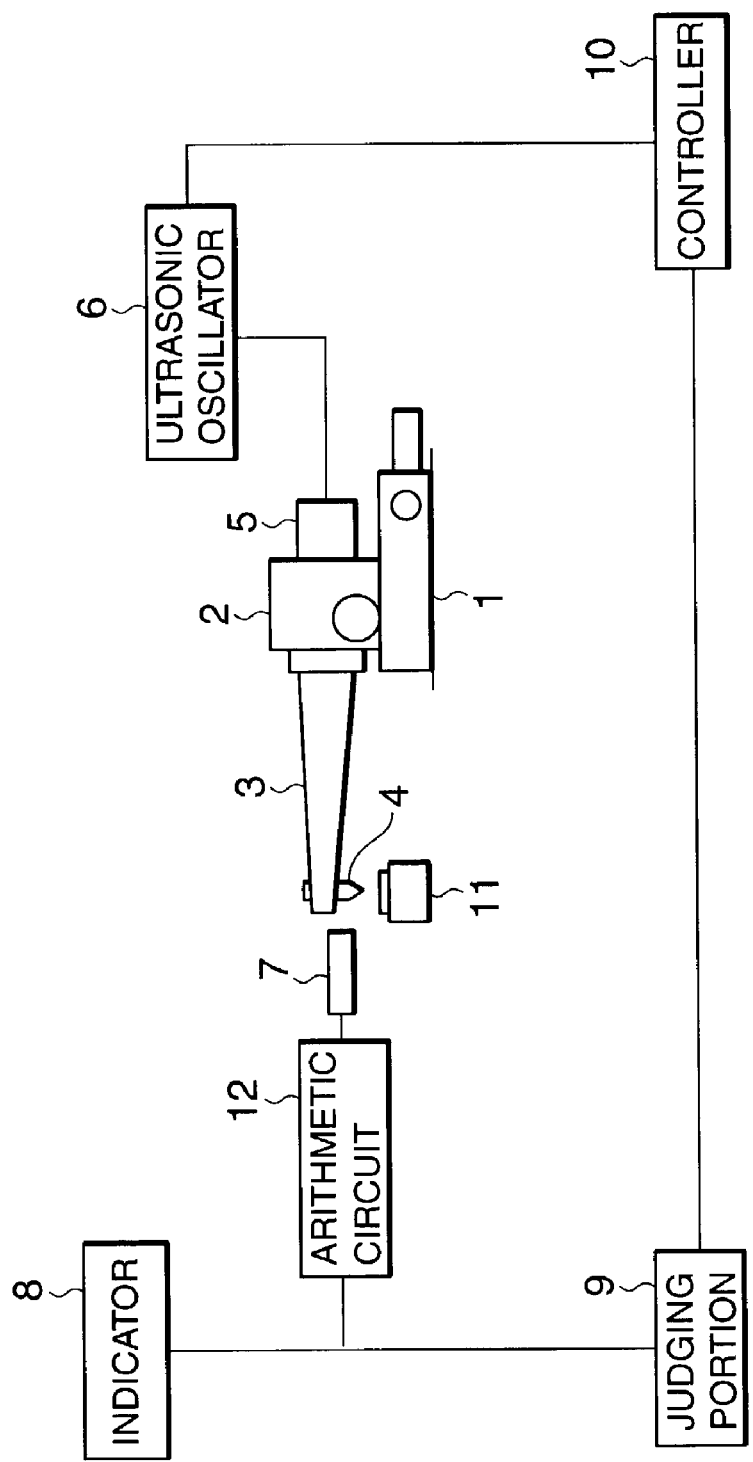
FIG. 2 is a schematic structural diagram showing a bonding apparatus according to a preferred embodiment of the present invention.

Hereinbelow, the present invention will be described with reference to the accompanying drawings. FIG. 2 is a schematic structural diagram of a bonding apparatus according to a preferred embodiment of the present invention. In this embodiment, the bonding apparatus is a wire bonder.

An ultrasonic horn 3 as an ultrasonic vibrating member is attached to a Z-movable mechanism 2 placed on an X-Y table 1, and a bonding tool (capillary) 4 also as an ultrasonic vibrating member is attached to the tip of the ultrasonic horn 3.

In the bonding tool 4, a gold wire (not shown) drawn out from a reel (not shown) is passed therethrough.

To the other end of the ultrasonic horn 3 is coupled an ultrasonic vibrator (transducer) 5 that is connected to an ultrasonic oscillator 6, so that ultrasonic vibration is caused by the ultrasonic vibrator 5. This vibration causes friction via the bonding tool 4 between the gold wire passing through the bonding tool 4 and a work 11, thereby realizing bonding therebetween.

The foregoing operation is controlled by a controller 10. Though not shown, there are further provided a torch for forming a ball at the tip of the gold wire and a clamper for retaining and tearing off the gold wire.

An ultrasonic detector 7 is disposed in a position, spaced apart from the ultrasonic horn 3 or the bonding tool 4, where ultrasonic vibration from the ultrasonic horn 3 or the bonding tool 4 can be detected, and an output signal from the ultrasonic detector 7 is sent to an indicator 8 and a checker 9, that is, a judging portion 9 via an arithmetic circuit 12.

First, it is possible to confirm the ultrasonic vibration state by means of the indicator 8 displaying the output signal from the ultrasonic detector 7.

Herein, the ultrasonic detector 7 represents anything that can detect ultrasonic vibration. For example, it represents a detector that can detect ultrasonic vibration, such as a non-contact detector using a laser beam, or a contact detector using a piezoelectric element.

The indicator 8 represents an indicator that displays values of the output signal as they are, or an indicator that displays a waveform obtained by Fourier transforming the output signal, or values thereof.

Figure 3A:
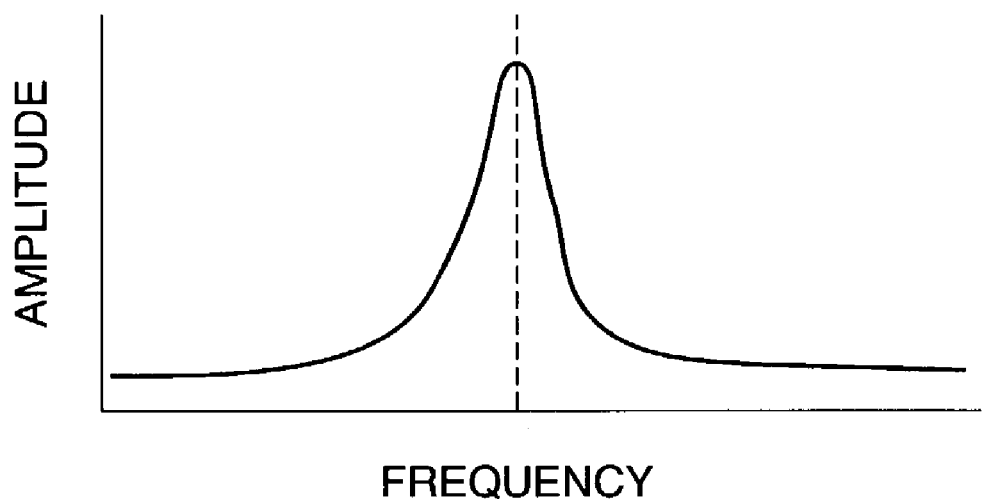
FIGS. 3A and 3B are graphs each showing a relationship between frequencies and ultrasonic amplitudes for explaining an operation of the bonding apparatus shown in FIG. 2.
Figure 3B:
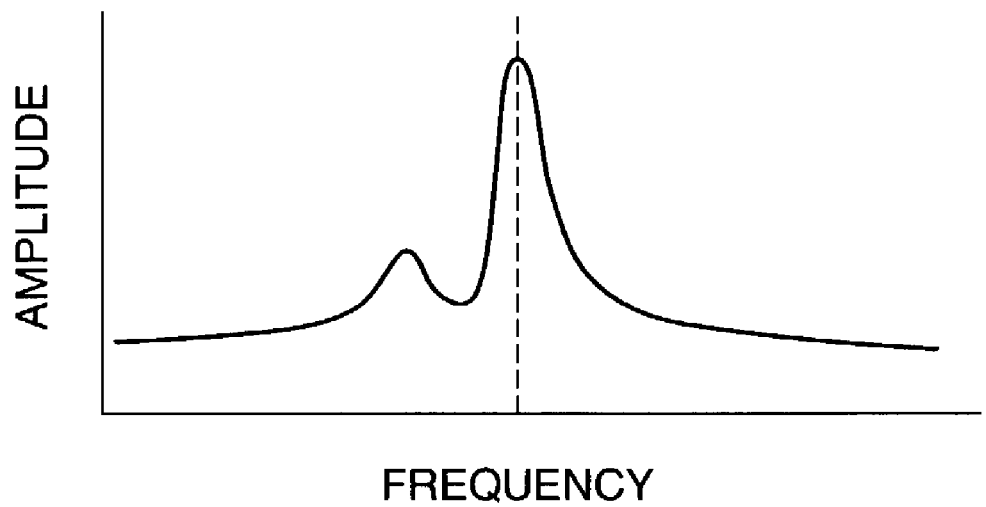

Examples of waveforms obtained by Fourier transforming output signals from the ultrasonic detector 7 are shown in FIGS. 3A and 3B.

Each of FIGS. 3A and 3B is a graph wherein the axis of abscissas is defined in terms of frequencies while the axis of ordinates is defined in terms of voltage values representing amplitudes. FIG. 3A shows a waveform in the state where oscillation is properly generated at a frequency of the ultrasonic vibrator. A frequency where an extremely large voltage value is caused is an oscillation frequency of ultrasonic waves themselves. In this state, voltage values at frequencies other than the ultrasonic frequency are extremely lower than the voltage value at the ultrasonic frequency.

On the other hand, FIG. 3B shows a waveform upon bonding failure wherein relatively high voltage values are caused at a plurality of frequencies. In this state, oscillation is generated also at a frequency other than the frequency of the ultrasonic vibrator, so that bonding failure is resulted.

Figure 4A:
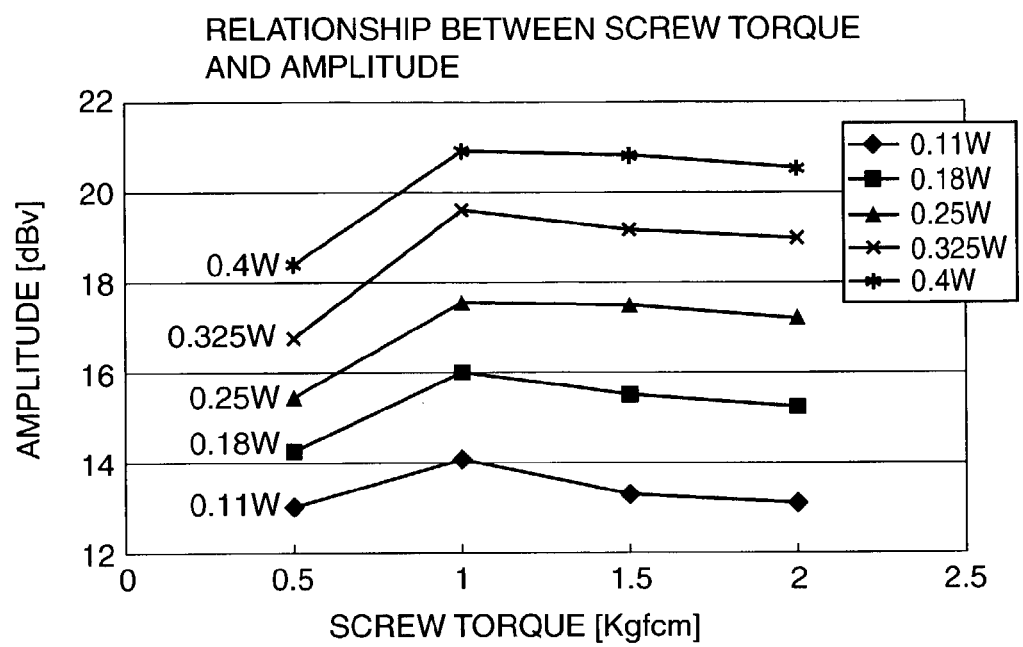
FIGS. 4A and 4B are graphs respectively showing a relationship between screw torques of a bonding tool and ultrasonic amplitudes per ultrasonic power, and a relationship between applying loads and ultrasonic amplitudes per ultrasonic power, for explaining an operation of the bonding apparatus shown in FIG. 2.

A relationship between screw torques of the bonding tool 4 and output voltage values in the state of FIG. 3A is shown per ultrasonic power in FIG. 4A wherein the axis of abscissas is defined in terms of the screw torques of the bonding tool 4 while the axis of ordinates is defined in terms of the output voltage values.

Figure 4B:
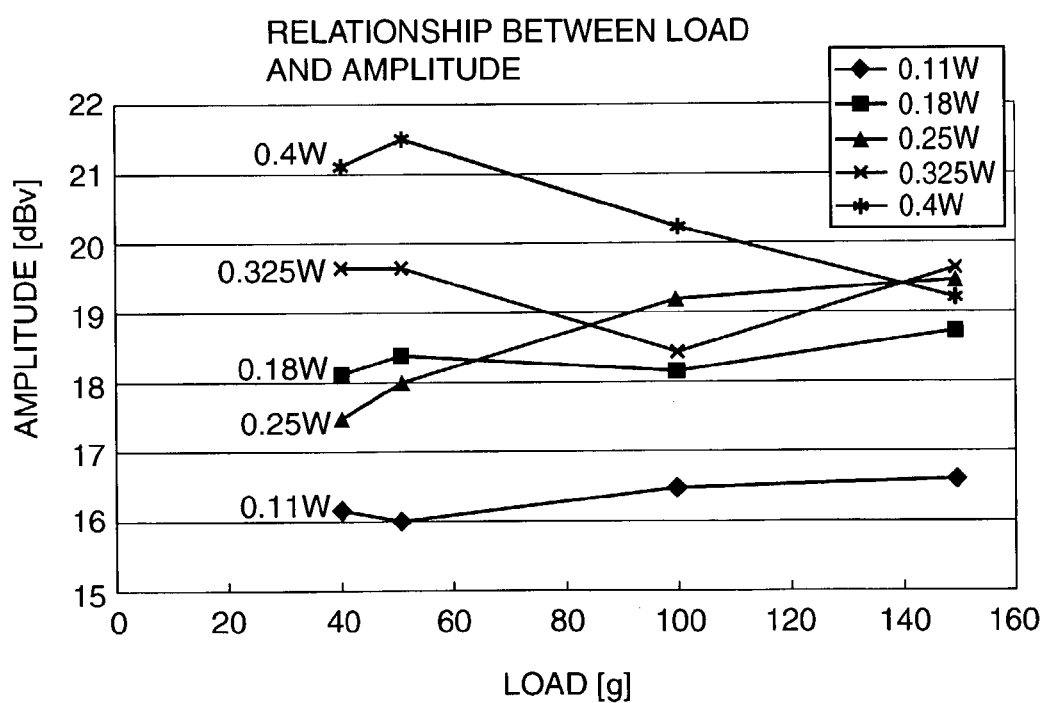

On the other hand, a relationship between applying loads to the work 11 and output voltage values in the state of FIG. 3A is shown per ultrasonic power in FIG. 4B wherein the axis of abscissas is defined in terms of the applying loads to the work 11 while the axis of ordinates is defined in terms of the output voltage values.

It is seen from FIG. 4A that a proper screw torque of the bonding tool 4 changes depending on the ultrasonic power and thus that there are proper screw torques corresponding to the ultrasonic powers, respectively.

Further, it is seen from FIG. 4B that, for realizing proper ultrasonic vibration by ultrasonic power or applying load, there is proper applying load or ultrasonic power.

Taking the foregoing two points into account, it is necessary to prestore output signals from the ultrasonic detector 7 or signals obtained by Fourier transforming them, which become criteria under all bonding conditions, i.e. in terms of the ultrasonic powers, the applying loads and the screw torques of the bonding tool.

In the actual bonding, a proper good or bad judgment can not be carried out without comparing those prestored output signals and an output signal from the ultrasonic detector 7 upon bonding. However, it can be judged only from the waveform of FIG. 3A or 3B whether or not proper ultrasonic oscillation is generated.

Then, the checker 9 as the judging portion judges based on the output signal from the ultrasonic detector 7 whether the bonding state is good, i.e. non-defective, or bad, i.e. defective, and sends a signal indicative of good or bad to the controller 10.

Herein, the controller 10 and the judging portion 9 may be combined in one part. Further, the function of the arithmetic circuit 12 may be included in the indicator 8 and/or the judging portion (checker) 9.

In case of the bad indicative signal, the checker 9 or the controller 10 issues an alarm and stops the operation of the bonding apparatus. Alternatively, the checker 9 or the controller 10 issues an alarm, removes a defective chip, and continues bonding to another chip.

History of results of those good or bad judgments is stored and managed. By doing so, the productivity is improved because chips can be produced without processing or treating defective portions in the processing subsequent to the bonding process.

Further, using such a history, it serves to look into the tendency or cause about bonding failure so as to enable stable bonding, and hence the productivity is improved.

Figure 5:
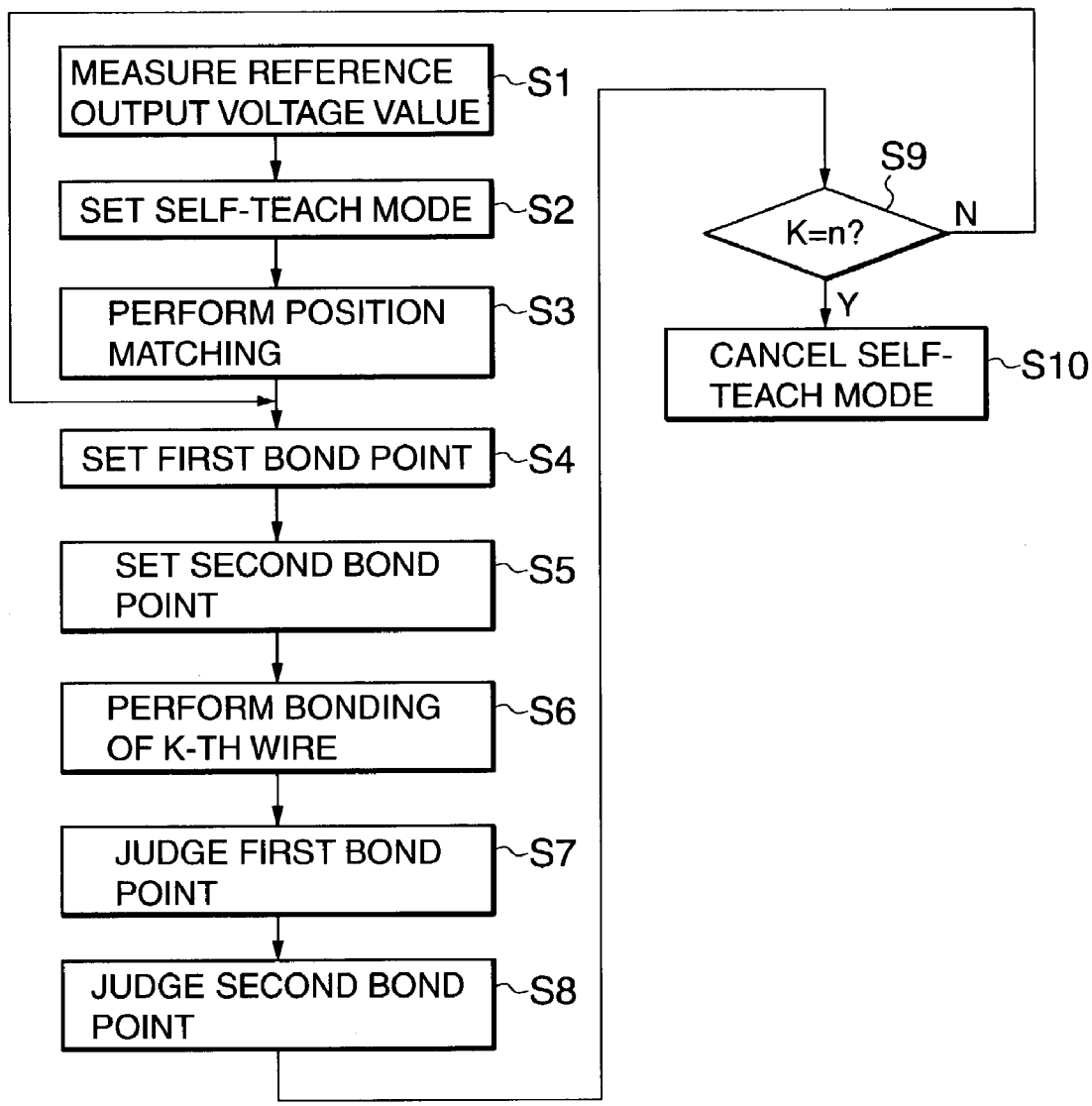
FIG. 5 is a flowchart showing a bonding method according to the preferred embodiment of the present invention.

Now, an operation of the bonding apparatus will be described with reference to FIG. 5. FIG. 5 is a flowchart showing one embodiment of a bonding method of the present invention. The bonding apparatus shown in FIG. 2 is used for carrying out this bonding method.

First at step S1, among various bonding conditions, a relationship among an applying load, the ultrasonic power and an output signal of the ultrasonic detector is measured and set as a reference value or a reference signal. In this event, if relatively large output values are confirmed at a plurality of frequencies, namely, if a plurality of inflection points, i.e. peaks, of output voltage values exist in a signal obtained by Fourier transforming the output signal of the ultrasonic detector, the applying load and the ultrasonic power are out of balance, and thus proper bonding is not carried out. Accordingly, no reference values exist under that condition, and thus actual bonding is impossible under that condition. Therefore, it is necessary to express the reference value using, at least, a pair of the largest output value and a corresponding frequency.

The reference value or the reference signal can be set in a case where only one relatively large output value occurs. Herein, the reference signal represents the output signal itself, or a signal obtained by Fourier transforming the output signal.

This operation is implemented only in the beginning, and the reference value will be effective substantially permanently with respect to the subject bonding apparatus.

Then, various bonding conditions (heating temperature for chip placing platform, applying load, ultrasonic power, ultrasonic oscillation continuing time) are set.

Then at step S2, a self-teach mode for position matching of bonding points is selected. Subsequently at step S3, an operator performs position matching by operating the X-Y table 1 using a manipulator while watching a monitor and, if a plurality of position matching points exist on a chip, the same operations are implemented with respect to all the position matching points.

Then, the operator operates the X-Y table 1 using the manipulator to put a cursor on a first bond point of a first wire, and pushes a position setting switch (step S4).

Subsequently, the operator operates the X-Y table 1 using the manipulator to put the cursor on a second bond point of the first wire, and pushes the position setting switch (step S5).

Then, bonding is performed at the first bond point and the second bond point of the first wire (step S6).

Subsequently at steps S7 and S8, the operator determines whether an output signal of the ultrasonic detector 7 at each of the first and second bond points is displayed on the indicator 8, and whether a good or bad judgment on the bonding state is performed according to a judging process using the output signal, or a judging process using the reference value or the reference signal and the output signal. As a signal displayed on the indicator 8 or a signal displayed on the indicator 8 for the operator to make a good or bad judgment by watching the displayed state thereof, there is, except for the output signal itself of the ultrasonic detector 7, a signal obtained by processing the output signal, for example, a signal obtained by Fourier transforming the output signal.

As the good or bad judging method, there is a method in which the operator makes a good or bad judgment while watching the indicator 8. There are also those methods such as a method of making a good or bad judgment through comparison with the reference value, a method of making a good or bad judgment based on a variation in output signal or the rate of the variation, and a method of making a good or bad judgment based on a difference between the reference value and the output signal, a difference between the reference signal and the output signal, a variation thereof, or the rate of the variation. It is to be noted that any judging method may be adopted that uses the output signal from the ultrasonic detector 7, the reference value and the output signal, or the reference signal and the output signal.

Hereinbelow, examples about those judging processes will be given using figures.

Figure 6A:
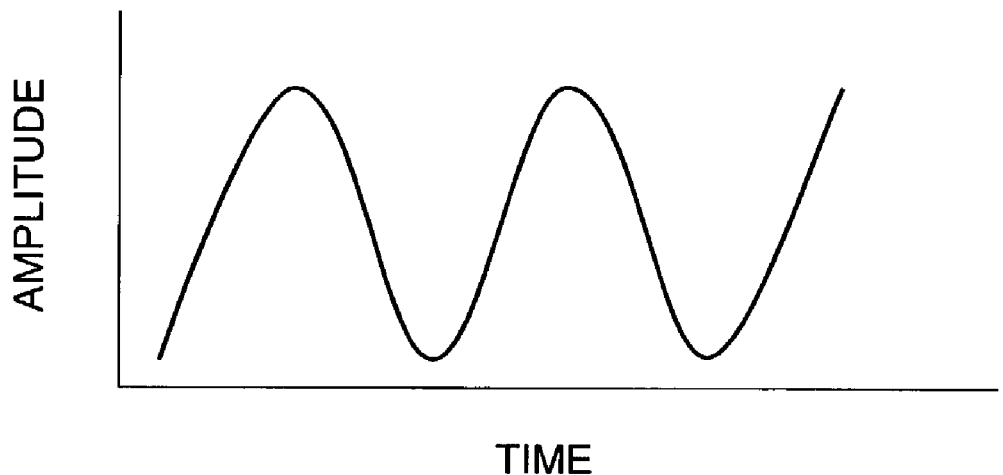
FIGS. 6A and 6B are graphs for explaining a first example of a judging process of the present invention.
Figure 6B:
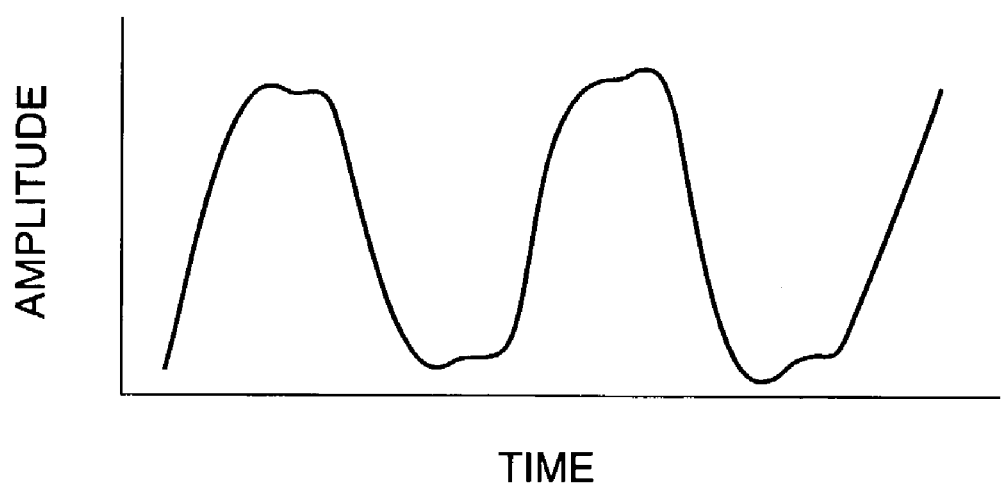

(1) FIGS. 6A and 6B each show an output signal from the ultrasonic detector 7, wherein FIG. 6A shows an example of a case where the bonding state is good, i.e. non-defective, while FIG. 6B shows an example of a case where the bonding state is bad, i.e. defective.

When the bonding state is non-defective, inasmuch as the amplitude is very large at one frequency, the output signal forms a smooth sine wave. On the other hand, when the bonding state is defective, inasmuch as a plurality of frequency components are included, the output signal forms a somewhat distorted sine wave. With respect to this example, there are those methods such as a method in which an operator makes a good or bad judgment by watching both waveforms, a method of prestoring a waveform of non-defective bonding, i.e. the waveform of FIG. 6A, and making a good or bad judgment by confirming similarity between the waveform of non-defective bonding and a waveform in question, and a method of making a good or bad judgment by calculating the rate of variation in output signal waveform.

Figure 7A:
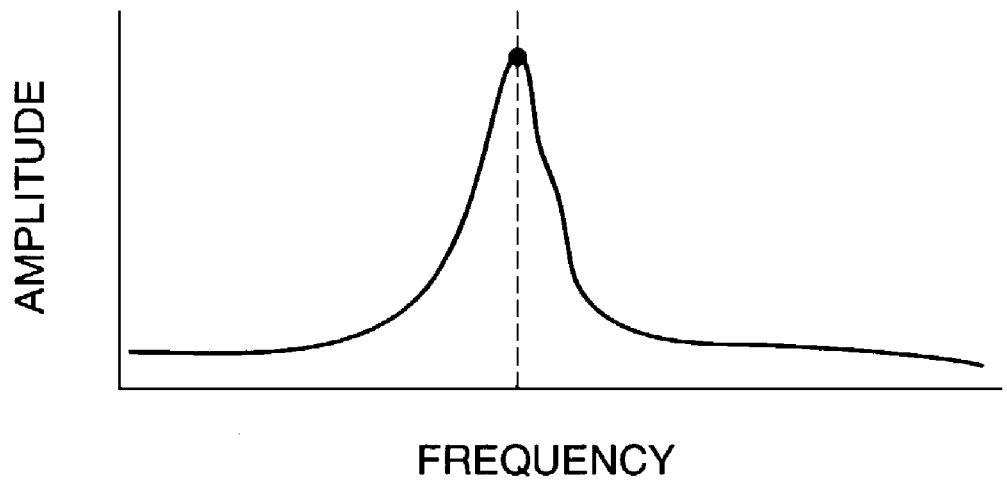
FIGS. 7A and 7B are graphs for explaining a second example of a judging process of the present invention.
Figure 7B:
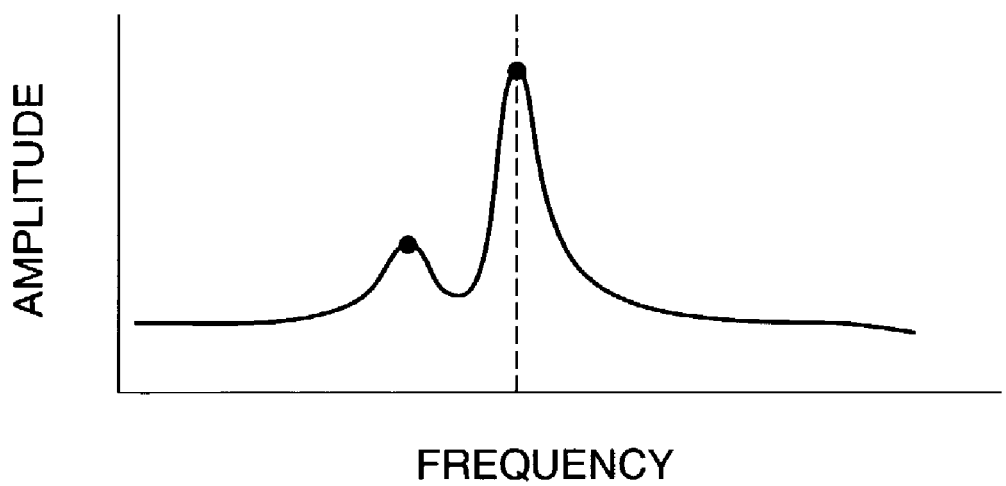

(2) FIGS. 7A and 7B each show a waveform obtained by Fourier transforming an output signal from the ultrasonic detector 7, wherein FIG. 7A shows an example of a case where the bonding state is good, i.e. non-defective, while FIG. 7B shows an example of a case where the bonding state is bad, i.e. defective.

This is a judging method wherein the number of peaks (mark •) is derived from the waveform and, when the number of the peaks is not one, i.e. in case of like FIG. 7B, the bonding state is judged to be defective. Namely, when a plurality of the peaks exist, proper ultrasonic waves are not applied, so that the bonding state can be judged to be defective.

As an example of the method of deriving the number of the peaks, there is a method of deriving the number of inflection points by differentiating a waveform. Except for such the process, there are various other processes for deriving the number of the peaks. However, the processes are not limited in the present invention.

Figure 8A:
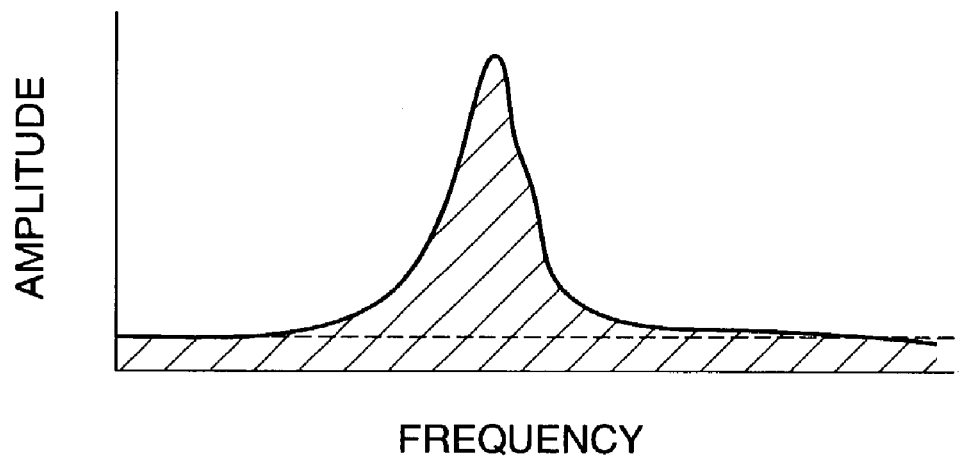
FIGS. 8A and 8B are graphs for explaining a third example of a judging process of the present invention.
Figure 8B:
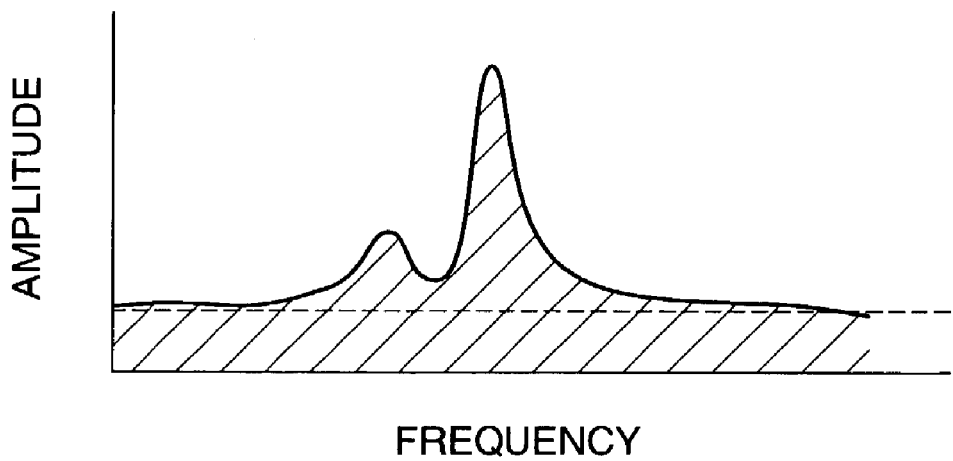

(3) FIGS. 8A and 8B each show a waveform obtained by Fourier transforming an output signal from the ultrasonic detector 7, wherein FIG. 8A shows an example of a case where the bonding state is good, i.e. non-defective, while FIG. 8B shows an example of a case where the bonding state is bad, i.e. defective.

This is a method wherein the integrated amplitude amount, i.e. the integrated amount of amplitudes over frequencies (area of a hatched portion in each of FIGS. 8A and 8B), is calculated from the waveform, and a good or bad judgment is performed through comparison with the integrated amplitude amount of non-defective bonding. Specifically, in case of defective bonding, the calculated integrated amplitude amount is somewhat greater or smaller as compared with the integrated amplitude amount of non-defective bonding. In calculation of the integrated amplitude amount, the amplitudes may be integrated over a specific frequency range or over the entire frequency range.

There may be such a case where it is better to derive the foregoing integrated amplitude amount using values obtained by subtracting the minimum amplitude value (amplitude value identified by a dotted line in each of FIGS. 8A and 8B) from amplitude values for all frequencies. For example, in case of the waveform shown in FIG. 8B, i.e. when there are a plurality of frequencies where the amplitudes are large, there is such a case where the amplitudes are relatively large over all frequencies on the whole. In this event, by subtracting an offset, the increased portion of the amplitudes can be removed. By doing so, in case of FIG. 8B, since the integrated amplitude amount is smaller than that of FIG. 8A where the bonding is non-defective, the bonding state can be judged to be defective.

Figure 9A:
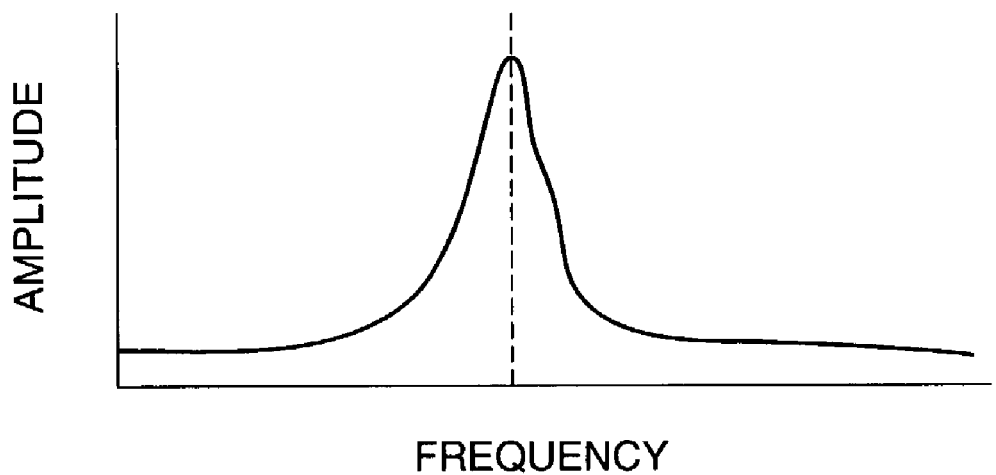
FIGS. 9A and 9B are graphs for explaining a fourth example of a judging process of the present invention.
Figure 9B:
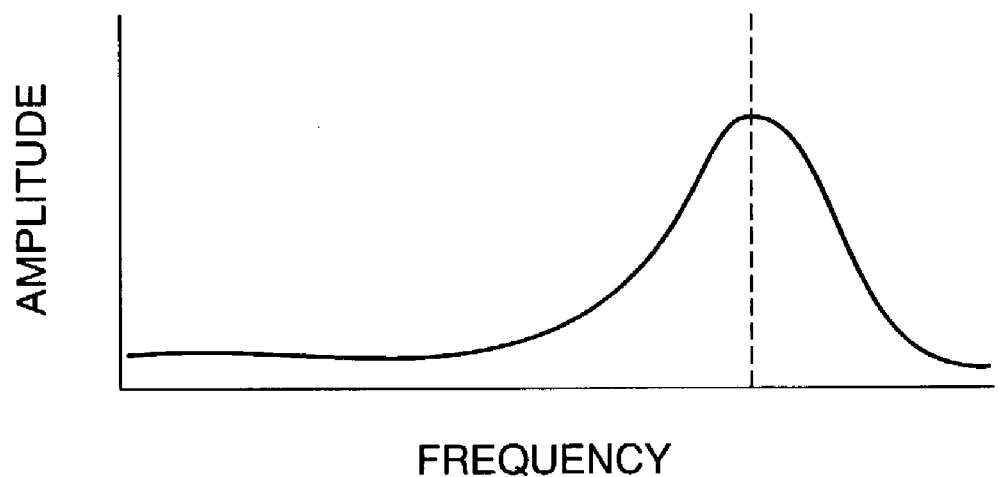

(4) FIGS. 9A and 9B each show a waveform obtained by Fourier transforming an output signal from the ultrasonic detector 7, wherein FIG. 9A shows an example of a case where the bonding state is good, i.e. non-defective, while FIG. 9B shows an example of a case where the bonding state is bad, i.e. defective.

This is a method of making a good or bad judgment based on a frequency value (value identified by a dotted line in each of FIGS. 9A and 9B) that exhibits the foregoing amplitude peak in the waveform. Specifically, if, through comparison, the frequency exhibiting the amplitude peak falls within the frequency range where the bonding is non-defective, the bonding state is judged to be non-defective, or otherwise, the bonding state is judged to be defective. When ultrasonic waves are applied while the peak frequency is outside the frequency range of non-defective bonding, inasmuch as the bonding state is changed from that of non-defective bonding, the non-defective bonding can not be achieved.

Figure 10A:
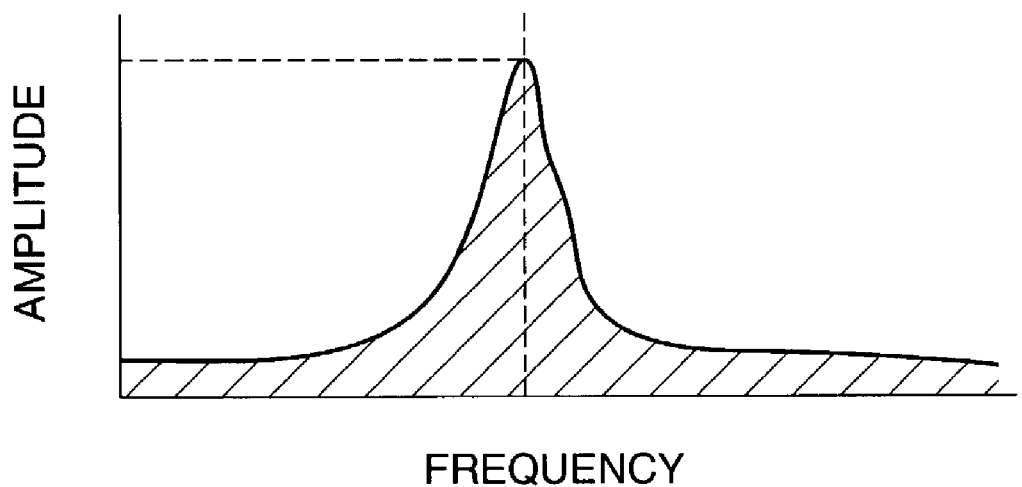
FIGS. 10A and 10B are graphs for explaining a fifth example of a judging process of the present invention.
Figure 10B:
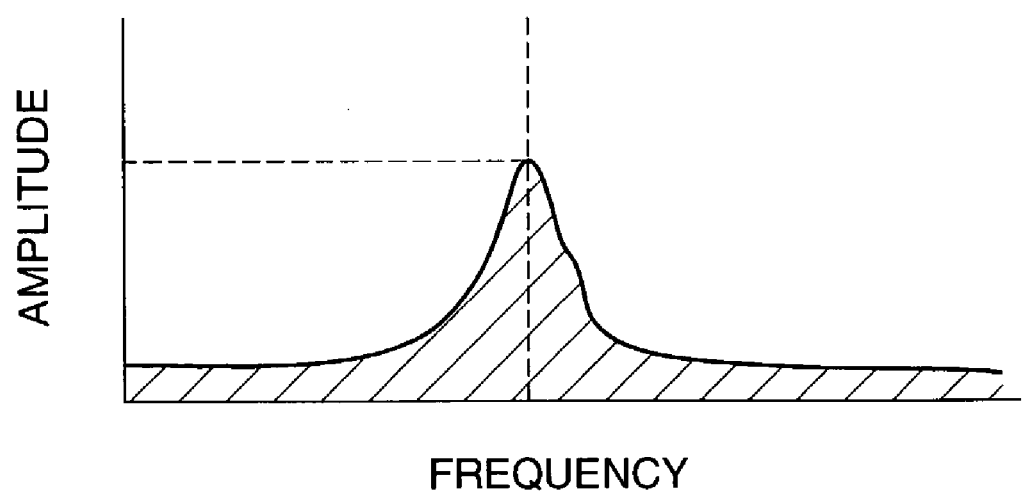

(5) FIGS. 10A and 10B each show a waveform obtained by Fourier transforming an output signal from the ultrasonic detector 7, wherein FIG. 10A shows an example of a case where the bonding state is good, i.e. non-defective, while FIG. 10B shows an example of a case where the bonding state is bad, i.e. defective.

This is a method of making a good or bad judgment based on a value of the foregoing amplitude peak (value identified by a horizontal dotted line in each of FIGS. 10A and 10B) in the waveform. Specifically, if, through comparison, the peak amplitude value falls within the amplitude range where the bonding is non-defective, the bonding state is judged to be non-defective, or otherwise, the bonding state is judged to be defective. When ultrasonic waves are applied while the peak amplitude value is outside the amplitude range of non-defective bonding is inasmuch as insufficient bonding or excessive bonding is resulted as compared with non-defective bonding, the non-defective bonding can not be achieved.

When finally making a good or bad judgment on the bonding state, one of the foregoing judging processes (1) to (5) may be simply used, or a judging process may be used wherein, in each of all possible combinations thereof, any possible logical calculation such as logical sum or logical product is carried out between the respective judging processes (1) to (5) to make a good or bad judgment.

As a noise countermeasure for a signal or a waveform to be used in the foregoing judging processes, smoothing or other processing may be implemented. However, the noise removing method is not limited in the present invention.

As shown in FIG. 5, the judgment is performed per bonding wire, and a wire number and the corresponding judgment can be confirmed in a one-to-one manner. If the bonding state is judged to be non-defective, the routine returns to step S4 via step S9 so that the same operations are repeated until position setting for the n-th wire has been finished.

If the bonding state is judged to be defective after bonding of the first or subsequent wire, setting of bonding conditions is performed again and bonding is performed again. If the position matching and the bonding are finished with respect to all bonding wires, and further, if the bonding state is judged to be non-defective with respect to all bonding points, the self-teach mode is canceled at step S10. The output signal from the ultrasonic detector in the self-teach mode may be used as a reference value or a reference signal upon making a good or bad judgment in the actual bonding operation.

Then, the actual bonding operation is implemented. In the actual wire bonding, a good or bad judgment is carried out with respect to each of the first and second bond points of each bonding wire in the same manner as described above.

If the bonding state is judged to be defective, one of
A: issuing an alarm indicative of bonding failure;
B: stopping the bonding apparatus; and
C: removing the subject chip as a defective and
continuing the bonding operation for another chip, is implemented.
Alternatively,
A: issuing an alarm indicative of bonding failure; and
B: stopping the bonding apparatus, are both implemented.
Alternatively,
A: issuing an alarm indicative of bonding failure; and
C: removing the subject chip as a defective and
continuing the bonding operation for another chip, are both implemented.

Further, if the bad or defective judgment is made continuously a prescribed number of times, for example, three times, so that the checker 9 judges that the time for replacing the capillary has been reached,
D: issuing an alarm indicative of capillary replacement;
E: stopping the bonding apparatus; and
F: removing the subject chip as a defective,
are implemented, and the operator replaces the bonding tool (capillary).

Upon replacing the bonding tool, the bonding tool is screwed by judging based on the output signal from the ultrasonic detector and its reference signal.

Further, when setting bonding parameters upon changing the type of works, the proper bonding state can be judged by performing operations like those in the foregoing self-teach mode, so that the setting of the bonding parameters can be easily carried out.

In the foregoing preferred embodiment, the description has been made about the wire bonder. However, the invention is not to be limited thereto, but can be suitably modified in various ways within the scope as defined by the appended claims. For example, the present invention is applicable to any bonding apparatus using ultrasonic waves, such as a flip chip bonder or a die bonder.

As described above, according to the present invention, a good or bad judgment on the bonding state can be carried out with respect to each of all bond points by quantitatively calculating the actual ultrasonic vibration in the ultrasonic bonding, so that the following advantages can be accomplished.

The first advantage is that a mechanical change around the ultrasonic horn, i.e. deterioration of the capillary or a change in mechanical characteristic thereof, can be quantitatively seized.

The reason thereof is that mechanical vibration of the capillary is directly measured by the ultrasonic detector.

The second advantage is that inasmuch as an output signal of the ultrasonic vibrator changes according to a load applied to the work and the ultrasonic power, even if the applying load or the ultrasonic power changes, it is possible to make a good or bad judgment on the bonding state.

The reason thereof is that output signals from the ultrasonic detector are measured in advance by changing the applying load and the ultrasonic power, and the values measured in advance are used as reference values.

The third advantage is that it is possible to make definite the time for replacing the bonding tool.

The reason thereof is that if the bad or defective judgment is made continuously a prescribed number of times, it can be judged that the time for replacing the bonding tool has been reached, so that the time for replacing the bonding tool is made clear.

The fourth advantage is that the time can be shortened for an initial bonding position setting operation.

The reason thereof is that output signals of the ultrasonic detector are measured in advance by changing the applying load and the ultrasonic power, so that a good or bad judgment on the bonding state can be easily performed using the corresponding output signal as a reference value.

The fifth advantage is that the bonding quality can be improved.

The reason thereof is that the bonding states of all bond points are monitored.

The sixth advantage is that inasmuch as only non-defective semiconductor devices can be manufactured in the processing subsequent to the bonding process, the productivity is improved.

The reason thereof is that inasmuch as the bonding states of all bond points, i.e. the bonding states and defective bonding portions, are managed, those works that are judged to be defective in bonding can be removed in the processing subsequent to the bonding process.

The seventh advantage is that the time for replacing the bonding tool can be quantitatively seized.

The reason thereof is that the bonding states of all bond points are monitored.

The eighth advantage is that, upon replacing the bonding tool, reproduction of mechanical characteristics thereof can be simplified by monitoring it with the ultrasonic detector, thus resulting in time reduction.

The reason thereof is that output signals from the ultrasonic detector are measured in advance by changing the applying load and the ultrasonic power, and the values measured in advance are used as reference values.

The ninth advantage is that when setting bonding parameters upon changing the type of works, the proper bonding state can be easily achieved.

The reason thereof is that output signals from the ultrasonic detector are measured in advance by changing the applying load and the ultrasonic power, and used as reference values.

What is claimed is:

1. A bonding apparatus for performing ultrasonic bonding comprising:
    an ultrasonic vibrating member;
    an ultrasonic detector for detecting an ultrasonic vibration state of said ultrasonic vibrating member;
    conversion means for converting an output of said ultrasonic detector to a frequency domain signal; and
    judging means for judging a bonding state, on the basis of said frequency domain signal.

2. A bonding apparatus according to claim 1, wherein said conversion means is a Fourier transformer.

3. A bonding apparatus according to the claim 1, wherein said judging means includes comparison means for comparing said frequency domain signal with a converted reference signal which were stored therein.

4. A bonding apparatus according to the claim 3, wherein said converted reference signal includes frequency data which have large amplitude.

5. A bonding apparatus according to the claim 1, wherein said judging means judges said bonding state, on the basis of the number of peaks of said frequency domain signal.

6. A bonding apparatus according to the claim 1, wherein said judging means judges said bonding state, on the basis of the integrated amount of said frequency domain signal.

7. A bonding apparatus according to the claim 1, wherein said judging means judges said bonding state, on the basis of a frequency value corresponding to the peak of said frequency domain signal.

8. A bonding apparatus according to the claim 1, wherein said judging means judges said bonding state, on the basis of the peak value of said frequency domain signal.

* * * * *

UNITED STATES PATENT AND TRADEMARK OFFICE
CERTIFICATE OF CORRECTION

| | |
|---|---|
| PATENT NO. | : 6,962,281 B2 |
| APPLICATION NO. | : 10/436088 |
| DATED | : November 8, 2005 |
| INVENTOR(S) | : Mitsunori Kanemoto, Hiromi Sueda and Keiji Takamura |

Page 1 of 1

It is certified that error appears in the above-identified patent and that said Letters Patent is hereby corrected as shown below:

Col. 8 Line 7, delete "the", insert -- a --page 18, Line 24

Signed and Sealed this

Twelfth Day of September, 2006

JON W. DUDAS
*Director of the United States Patent and Trademark Office*